United States Patent [19]

Ikeda et al.

[11] 4,139,391

[45] Feb. 13, 1979

[54] LIGHT-SENSITIVE RESIN COMPOSITION AND METAL IMAGE-FORMING MATERIAL USING THE SAME

[75] Inventors: Tomoaki Ikeda, Asaka; Hiroshi Misu; Yoshimasa Aotani, both of Minami-ashigara; Fumiaki Shinozaki, Asaka, all of Japan

[73] Assignee: Fuji Photo Film Co., Ltd., Minami-ashigara, Japan

[21] Appl. No.: 767,865

[22] Filed: Feb. 11, 1977

[30] Foreign Application Priority Data

Feb. 16, 1976 [JP] Japan .................................. 51-16302

[51] Int. Cl.² .............................................. G03C 1/68
[52] U.S. Cl. .................................. 96/115 R; 96/35.1; 96/86 P
[58] Field of Search .................. 96/86 P, 115 R, 35.1, 96/115 P

[56] References Cited

U.S. PATENT DOCUMENTS 2,760,863   8/1956   Plambeck, Jr. ...................... 96/86 P

*Primary Examiner*—John D. Welsh
*Attorney, Agent, or Firm*—Sughrue, Rothwell, Mion, Zinn and Macpeak

[57] ABSTRACT

A light-sensitive resin composition containing (a) at least one ethylenically unsaturated compound having at least two terminal ethylenically unsaturated groups, which is capable of forming a polymer through photo-addition polymerization, and which has a boiling point of about 100° C. or higher at atmospheric pressure, (b) an addition polymerization initiator activatable by irradiation with actinic radiation, and (c) an organic high polymer binder having water-solubilizing groups in the side chains thereof, wherein the improvement comprises the binder being a copolymer containing (A) a repeating unit derived from at least one compound selected from the group consisting of acrylic acid and methacrylic acid and (B) a repeating unit derived from at least one compound selected from the group consisting of benzyl acrylate, benzyl methacrylate, phenethyl acrylate, phenethyl methacrylate, 3-phenylpropyl acrylate, 3-phenylpropyl methacrylate, 4-phenylbutyl acrylate and 4-phenylbutyl methacrylate.

13 Claims, 1 Drawing Figure

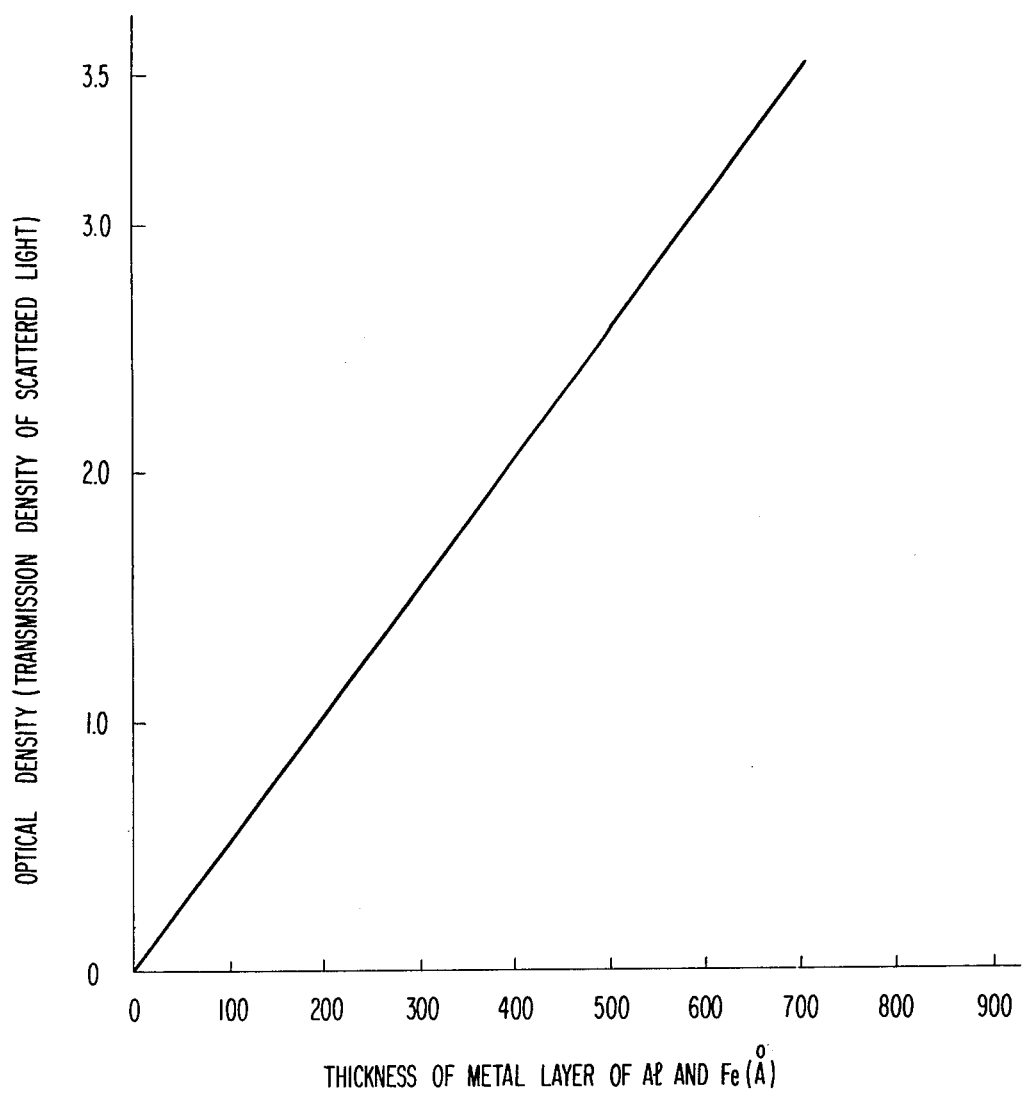

LIGHT-SENSITIVE RESIN COMPOSITION AND METAL IMAGE-FORMING MATERIAL USING THE SAME

BACKGROUND OF THE INVENTION

1. Field of the Invention

The present invention relates to a light-sensitive resin (or photoresist) composition and a metal image-forming material using the same. More particularly, it relates to a light-sensitive resin composition containing an ethylenically unsaturated compound having at least two terminal ethylenically unsaturated groups, a photo-addition polymerization initiator, and an organic binder containing a repeating unit derived from a specific aralkyl acrylate or aralkyl methacrylate and a repeating unit derived from acrylic acid or methacrylic acid, capable of being dissolved or swollen in an alkaline aqueous solution, and to a metal image-forming material using the same.

2. Description of the Prior Art

Heretofore, lithographic films of an ultra-high-contrasty silver halide emulsion have generally been mainly used in an image-forming process suitable for half dot line working. While the invention with ordinary silver halide emulsions is to reproduce a halftone gradation, the intention with lithographic films for the graphic arts is to form images of transparent areas and blackened opaque areas alone. Therefore, of the characteristics which lithographic films possess, it is necessary in particular that the images obtained have a clear outline and provide an accurate line width. Actually, however, these characteristics are obtained only with difficulty for the following reasons in practical image formation using lithographic films.

Firstly, lithographic films have a width of from the base optical density to the maximum optical density in the characteristic curve, although they should desirably form transparent areas and blackened areas which are distinct and discriminatable from each other. This width in the characteristic curve results in fringe being formed around the images.

Secondly, size of the image areas tends to expand and grow as the developing time is lengthened, since development of lithographic films is based on infectious development. Therefore, stopping development is difficult, and the line width tends to change. Also, infectious development not only influences the formation of fringe but also makes precise control of development difficult.

Further, in order to acquire workers, too, it is desired and expected in this field to change the working location to a room bright enough such that presensitized plates are exposed. Since silver is a resource which is limited, from the viewpoint of effectively using restricted resources such as silver, too, it is eagerly desired to solve the above-described problems using non-silver salt light-sensitive materials. On considering the above from a market standpoint, several products utilizing organic compounds have recently been marketed commercially. For example, diazo type SG positive films (made by Scott Co.), diazo type contact films (made by Oce Co.), photochromic films (made by Dai-Nippon Printing Co., Ltd.), and the like are available. However, these films have at least two defects. One defect is that image areas having an optical density as high as 3.5 or more are difficult to form. The other defect is that dot etching, which is necessary as films for contact, is difficult.

As an image-forming process for possibly attaining such objects, Japanese patent application (OPI) No. 139720/75 (corresponding to U.S. patent application Serial No. 571,817, filed Apr. 25, 1975 now U.S. Pat. No. 4,008,084) describes an image-recording material comprising a transparent support having provided thereon a thin layer of an aluminum-iron alloy and a light-sensitive resin layer in this order. Furthermore, Japanese Patent Publication No. 14161/75, Japanese patent application (OPI) No. 65928/73 (corresponding to U.S. patent application Ser. No. 205,861, filed Dec. 8, 1971), 65927/73 (corresponding to U.S. patent application Ser. No. 205,860, filed Dec. 8, 1971) and 2925/75 describe a process for forming metal images by using an image-forming material comprising a support having provided thereon an opaque thin layer of a metal such as tellurium, molybdenum, polonium, cobalt, zinc, aluminum, copper, nickel, iron, tin, vanadium, germanium, silver or silver emulsion and, further, a light-sensitive resin layer (as described hereinafter) thereon, subjecting the image-forming material to an image-wise exposure, developing the light-sensitive resin layer, and etching the uncovered metal layer with a second solution; and a process for forming images by conducting, after image-wise exposure, a mono-bath development processing using an alkaline developer containing sodium hypochlorite to thereby selectively remove the resin layer and simultaneously or substantially simultaneously etching the metal layer. The latter process is superior to a conventional two-bath development from the standpoint of shortening the working steps.

When an aluminum layer or an aluminum-iron alloy layer is used as the metal layer from the viewpoint of minimizing environmental pollution, an alkaline solution or an acidic solution may be used as an etching solution. However, in the etching process utilizing this mono-bath development, an alkaline etching solution is advantageous, since some photo-polymerizable light-sensitive resins require alkaline development after exposure. Further, with reprographic copying materials for producing printed circuit plates or for optically producing printing plates, too, an alkaline water developer is advantageous from the viewpoint of preventing environmental pollution as compared with a developer using an organic solvent, and provides the advantages of low cost, good stability and simple after-treatment. Further, dissolved copying materials can be separated from the used developer by acidifying and subsequent filtration.

Photo-polymerizable copying layers which can be developed with an alkaline aqueous solution are known. The desired properties can generally be obtained by adding a binder which is soluble or at least swellable in an alkaline aqueous medium. For this purpose, homopolymers or copolymers having groups whose solubility in water/alkali medium is controlled such as a carboxylic acid group, a carboxylic acid anhydride group or a phenolic or alcoholic hydroxy group or the like are used. However, these alkali-developable, photo-polymerizable light-sensitive resin compositions for forming a protective layer have the defect that hardened resist areas tend to have inferior chemical resistance, particularly, alkali resistance. Therefore, in the production of printed circuit plates, processing solutions such as an etching solution and a plating solution are limited. In addition, in the above-described process for forming metal images for use as films for contact, reduction of dot images is particularly disadvantageously conducted.

Because, a much stronger reducer than a developer must be used when an alkaline reducer is used, in order to thin the dots of the dot images formed by the development, by etching metal in a short time utilizing side etching. Therefore, when the resist layer does not possess sufficient alkali resistance, pinholes will be formed in the dots or, in the extreme case, the dots themselves will be etched away.

Furthermore, the kind of binder used greatly influences the developability, sensitivity and mechanical strength of a resist film.

SUMMARY OF THE INVENTION

An object of the present invention is to provide a light-sensitive resin composition for forming a resist film whose properties are improved with respect to the above-described points.

The present invention accordingly provides (1) a light-sensitive resin composition containing (a) at least one ethylenically unsaturated compound having at least two terminal ethylenically unsaturated groups, capable of forming a polymer through photo-addition polymerization, and having a boiling point of not less than about 100° C. at atmospheric pressure, (b) an addition polymerization initiator activatable by irradiation with actinic radiation, and (c) an organic high polymer binder containing water-solubilizing groups in the side chains thereof, the binder being a copolymer containing (A) a repeating unit derived from at least one compound selected from the group consisting of acrylic acid and methacrylic acid and (B) a repeating unit derived from at least one compound selected from the group consisting of benzyl acrylate, benzyl methacrylate, phenethyl acrylate, phenethyl methacrylate, 3-phenylpropyl acrylate, 3-phenylpropyl methacrylate, 4-phenylbutyl acrylate and 4-phenylbutyl methacrylate; and (2) a metal image-forming material which comprises a base material having provided thereon a metal layer and a layer of the light-sensitive resin composition (1) described above in this order, and which provides images when subjected to image-wise exposure with electromagnetic waves and subsequently to a developing process using an alkaline developer to remove the light-sensitive resin composition layer and the metal layer in conformity with the pattern, with the metal layer containing, in contact with each other, aluminum and a metal having a lower ionization tendency than that of aluminum.

BRIEF DESCRIPTION OF THE ACCOMPANYING DRAWING

The FIGURE is a graph showing the relationship between the thickness of the metal layer of aluminum and iron and the optical density (transmission density of scattered light) in one example of the metal image-forming material of the present invention.

DETAILED DESCRIPTION OF THE INVENTION

Each of the components of the light-sensitive resin composition of the present invention will be described in detail below.

(a) As the ethylenically unsaturated compound having at least two terminal ethylenically unsaturated groups, which is capable of forming a polymer by photo-addition polymerization, and having a boiling point of not less than about 100° C. at atmospheric pressure (hereinafter referred to merely as a "monomer"), acrylic esters and methacrylic esters of polyhydric alcohols containing therein up to 6 hydroxy groups and having a molecular weight of up to about 1,000 are suitable. For example, acrylic esters and methacrylic esters of ethylene glycol, triethylene glycol, tetraethylene glycol, propylene glycol, trimethylolpropane, pentaerythritol, neopentyl glycol, etc., are illustrative. In addition, reaction product between an acrylic ester or methacrylic ester derived from bisphenol A, for example, bisphenol A-epichlorohydrin epoxy resin prepolymer and acrylic or methacrylic acid, acrylic or methacrylic esters of bisphenol A alkylene oxide adduct (e.g., an ethylene oxide adduct, a propylene oxide adduct, etc.) or of the hydrogenated product thereof may also be used. In addition to these esters, methylenebisacrylamide, methylenebismethacrylamide and bisacrylamides or bismethacrylamides of diamines (e.g., ethylenediamine, propylenediamine, butylenediamine, pentamethylenediamine, etc.) are also useful. Also, reaction products between diol monoacrylate or diol monomethacrylate and a diisocyanate, triacrylformal, triallyl cyanurate, etc., are also suitable. The term "diol" used herein includes ethylene glycol, propylene glycol, propane-1,3-diol, hexane-1,6-diol, etc. Other than these monomer compounds, linear high polymers having an acryloyloxy or methacryloyloxy group in the side chains, for example, open ring copolymers of glycidyl methacrylate, acrylic or methacrylic acid adducts of copolymers of glycidyl methacrylate and an ethylenically unsaturated monomer, etc., are also usable. From the point of view of light sensitivity, pentaerythritol tetraacrylate and trimethylolpropane triacrylate are particularly preferred monomers. The amount of the monomer to be used ranges from about 20 to about 70% by weight, preferably from 25 to 50% by weight, in the light-sensitive resin composition.

(b) As the addition polymerization initiator capable of initiating polymerization of the above-described monomers (a) upon irradiation with electromagnetic waves (hereinafter referred to merely as a photo-polymerization initiator), those conventional initiators generally known to be effective for use in combination with the monomer, including the following compounds, can be used. This invention, however, is not to be construed as being limited to these examples.

Specific examples of photo-polymerization initiators include acyloin derivatives such as acyloin, benzoin methyl ether, benzoin ethyl ether, benzoin butyl ether, etc.; decyl bromide, decyl chloride, decyl amine, etc.; ketones such as benzophenone, acetophenone, benzyl, benzoylcyclobutanone, etc.; substituted benzophenones such as Michler's ketone, diethoxyacetophenone, halogenated acetophenone, halogenated benzophenone, etc.; quinones and multinuclear quinones such as benzoquinone, anthraquinone, phenanthrenequinone, etc.; substituted multinuclear quinones such as chloroanthraquinone, methylanthraquinone, octamethylanthraquinone, naphthoquinone, dichloronaphthoquinone, etc.; halogenated aliphatic, alicyclic and aromatic hydrocarbons and mixtures thereof, wherein the halogen can be chlorine, bromine, fluorine or iodine (e.g., mono- and poly-chlorobenzene, mono- and poly-bromobenzene, mono- and poly-chloroxylene, mono- and poly-bromoxylene, dichloro-maleic anhydride, 1-(chloro-2-methyl)naphthalene, 2,4-dimethylbenzenesulfonyl chloride, 1-bromo-3-(m-phenoxyphenoxy)benzene, 2-bromoethyl methyl ether, chloromethylnaphthalene, bromomethylnaphthalene, diiodomethylnaphthalene, hexachlorocyclopentadiene, hexachlorobenzene, octachloropentene and mixtures thereof); and hetero ring compounds represented by lophine dimer (i.e., bis(2,4,5-triphenylimidazol-1-yl)), N-methyl-2-benzoylmethylene-β-naphthothiazole, N-ethyl-2-(2-thenoyl)methylene-β-naphthothiazole, etc. Examples of photo-polymerization initiators are described in J. Kosar, *Light-Sensitive Systems*, John Wiley & Sons, Inc., New York, (1965).

The amount of the photo-polymerization initiator used ranges from about 0.1% by weight to about 10% by weight, preferably from about 0.5% to about 5% by weight, based on the monomer (a).

(c) The organic high polymer binder having water-solubilizing groups in the side chains thereof (hereinafter referred to merely as a binder) has a molecular weight of about 500 to about 100,000, preferably about 500 to about 5,000, and is a copolymer containing (A) repeating units derived from acrylic acid or methacrylic acid and (B) repeating units derived from benzyl acrylate, benzyl methacrylate, phenethyl acrylate, phenethyl methacrylate, 3-phenylpropyl acrylate, 3-phenylpropyl methacrylate, 4-phenylbutyl acrylate or 4-phenylbutyl methacrylate and, if desired, (C) repeating units derived from other vinyl compounds copolymerizable therewith. Of the repeating units illustrated as (B), those derived from benzyl acrylate or benzyl methacrylate is preferred. In the above-described copolymers, repeating unit (A) is present therein in the range of from about 15% to about 40%, preferably from 25% to 35%, based on total repeating units.

Examples of other vinyl compounds (C), which may be used, include styrene or substituted styrene (e.g., vinyltoluene, p-chlorostyrene, α-chlorostyrene, α-methylstyrene, vinylethylbenzene, o-methoxystyrene, m-bromostyrene, etc.), vinylnaphthalene or substituted vinylnaphthalene, vinyl hetero ring compounds (e.g., N-vinylcarbazole, vinylpyridine, vinyloxazole, etc.), vinylcycloalkanes (e.g., vinylcyclohexane, 3,5-dimethylvinylcyclohexane, etc.), acrylamide, methacrylamide, N-alkylacrylamide, acrylonitrile, methacrylonitrile, aryl methacrylates such as phenyl methacrylate, tolyl methacrylate, etc., aralkyl methacrylates such as those as illustrated above, or the like. Of these vinyl compounds (c), styrene is preferred. A suitable amount of these vinyl compounds (c) is not higher than about 30% by weight, preferably not higher than 20% by weight.

The binder to be used in the present invention should have sufficiently good development properties that it can be processed with an alkaline developer to permit monobath development, that light sensitivity of the resulting light-sensitive composition is high, and that it shows good dot etching property (of light-sensitive layer in dot areas not being dissolved or swollen with a reducer) when used in a light-sensitive material for forming high-contrasty dot images.

In the light-sensitive resin composition to be used in the present invention may be incorporated various known thermal polymerization inhibitors to prevent thermal polymerization. Specific examples of suitable thermal polymerization inhibitors include, for example, p-methoxyphenol, hydroquinone, alkyl- or aryl-substituted hydroquinones, t-butylcatechol, pyrogallol, cuprous chloride, phenothiazine, chloranil, naphthylamine, β-naphthol, 2,6-di-t-butyl-p-cresol, pyridine, nitrobenzene, dinitrobenzene, p-toluidine, methylene blue, a copper salt of an organic acid (e.g., copper acetate, etc.), and the like. The term "alkyl" and "aryl" used hereinabove include methyl, ethyl, propyl, tert-butyl and pentyl, and phenyl, tolyl and xylyl, respectively. These thermal polymerization inhibitors may be incorporated in the range of from 0.001 to 5 parts by weight based on 100 parts by weight of the light-sensitive resin composition.

If desired, various additives such as colorants (dyes and pigments), plasticizers, resins, development accelerators, reinforcing materials, adhesiveness-improving agents, etc., may be incorporated in the light-sensitive resin composition to be used in the present invention. Suitable colorants include, for example, pigments such as titanium oxide, carbon black, iron oxide, phthalocyanine pigments, azo pigments, etc., and dyes such as methylene blue, crystal violet lactone, rhodamine B, fuchsine, auramine, azo dyes, anthraquinone dyes, etc. Of these, those which do not absorb light of the absorption wavelength of the light-sensitive polymer or the sensitizing agent are preferred. Such colorants can be employed in the light-sensitive resin composition in an amount ranging from about 0.1 to about 30 parts by weight (with respect to dyes) or from about 0.01 to about 10 parts by weight, preferably 0.1 to 3 parts by weight (with respect to pigments), based on 100 parts by weight of the total weight of light-sensitive resin composition.

Illustrative plasticizers are phthalates such as dimethyl phthalate, diethyl phthalate, dibutyl phthalate, diisobutyl phthalate, dioctyl phthalate, octylcapryl phthalate, dicyclohexyl phthalate, ditridecyl phthalate, butylbenzyl phthalate, diisodecyl phthalate, diaryl phthalate, etc.; glycol esters such as dimethylglycol phthalate, ethylphthalylethyl glycolate, methylphthalylethyl glycolate, butylphthalylbutyl glycolate, triethyleneglycol dicaprylate, etc.; phosphates such as tricresyl phosphate, triphenyl phosphate, etc.; aliphatic dicarboxylic acid esters such as diisobutyl adipate, dioctyl adipate, dimethyl sebacate, dibutyl sebacate, dioctyl azelate, dibutyl maleate, etc.; triethyl citrate, glycerin triacetyl ester, butyl laurate, etc.

The amount of the plasticizers and the above-described additives in the light-sensitive resin composition can be appropriately decided by those skilled in the art depending on these purposes. In general, a suitable amount of the plasticizers used is about 0.01 to about 30% by weight, preferably 0.1 to 20% by weight, and a suitable amount of the above-described additives used is about 0.01 to about 10% by weight, both being based on the weight of total light-sensitive resin composition.

The thus prepared light-sensitive resin composition is generally soluble in solvents such as acetone, methyl ethyl ketone, methyl isobutyl ketone, cyclohexanone, β-hydroxyethyl methyl ether (methyl Cellosolve), β-acetoxyethyl methyl ether, methyl Cellosolve acetate, dimethylformamide, tetrahydrofuran, chlorobenzene, triethylene glycol, etc., and are insoluble in solvents such as alcohols and hydrocarbons. Therefore, a suitable solvent (a single solvent or a mixture of solvents containing two or more organic solvents) can be selected from among the above-described solvents, and the light-sensitive resin composition is dissolved therein to prepare a coating solution.

The viscosity of the thus prepared coating solution of the light-sensitive resin composition is adjusted to the degree which permits use of conventionally known coating techniques. More specifically, the coating solution of the light-sensitive composition is coated on a metal layer of a base having a metal layer thereon using known coating processes such as whirler coating, dip coating, curtain coating, roll coating, spray coating, air knife coating, doctor knife coating and the like.

The solvent used is removed from the light-sensitive resin composition coated on the metal layer using known processes (e.g., drying). In the drying process, the composition is usually heated. Suitable heating temperatures generally range from about 20° C. to about 150° C., preferably from about 60° C. to about 110° C. Of course, the temperature for drying depends upon the boiling point of the solvent used but, needless to say, it is preferable to employ a temperature as low as possible within the above-described temperature range.

In the image-forming material of the present invention, the dry thickness of the above-described light-sensitive composition layer ranges from about 0.1 μm to about 10 μm, preferably from 0.4 μm to 5 μm. The thinner the thickness of the light-sensitive composition layer is, the better is the resolving power of the resulting metal images, but the lower is the mechanical strength of the layer and the more the developer permeates into the metal layer left. Therefore, the lower limit of the thickness of the light-sensitive composition layer should be decided balancing these factors. The thicker is the thickness of the light-sensitive composition layer, the poorer is the resolving power of the resulting metal images and the longer is the developing time which is accompanied by the phenomenon of side-etching.

As can be understood from the various embodiments above-described, the base material used in the present invention supports an image-forming metal layer provided thereon directly or indirectly (interposing other layer such as a subbing layer), and can be used in various forms taking into consideration the use of the image-forming materials of the present invention. Plate-like, sheet-like or film-like materials are suitable for the many uses of the image-forming materials of the present invention. The base material can be transparent or opaque depending on the uses thereof, but must not be etched by the etching solution used for etching the metal thin layer and a deterioration of adhesiveness which would cause or lead to delamination must not occur. Examples of materials for the base material include many of the conventionally known materials. For example, porcelains, amorphous glasses, crystalline glasses, papers, metals such as aluminum, zinc, copper, iron, nickel, magnesium, chromium, gold, platinum, silver, etc., metal alloys such as aluminum-iron, aluminum-magnesium, iron-chromium-nickel (stainless steel), copper-zinc (brass), etc., synthetic resins such as polyethylene terephthalate, cellulose acetates, cellulose acetate butyrate, cellulose acetate propionate, polycarbonates of bisphenol A, polystyrene, polyethylene, polypropylene, polyvinyl chloride, etc., and the composite materials thereof can be used. The term "composite materials" used herein refers to a material in which a plastic (synthetic resin) is laminated on a paper, a material in which a plastic is laminated on a metal layer, a material in which a metal is laminated on a glass or is deposited on a glass by vacuum evaporation, and the like. These materials include transparent and opaque base materials. If necessary, transparent base materials may be semi-opacified or opacified by adding a colorant or an opacifying agent thereto. However, in many possible uses, the image-forming material of the present invention must be such that with the images formed thereon light is transmitted through non-image areas where no metal layer exists and base surface is uncovered, but light is not transmitted in the image areas of the metal layer. That is, the so-called transparent-type image-forming materials are demanded in such field. Therefore, image-forming materials to be used in such a field should have a transparent base material. The term "transparent" as used herein means that the base materials pass electromagnetic waves having a wavelength of about 200 to 700 nm, in more detail, near-ultraviolet light and visible light in an amount of at least about 40%, preferably at least about 70%. Further, depending on the utility, the base material can be considered transparent if electromagnetic waves having a wavelength of about 330 to about 500 nm can be passed. On the other hand, if the image-forming material is to be applied to a field where the images formed are viewed using reflected light, the base material need not necessarily be transparent.

Specific embodiments of the metal layer to be provided in the image-forming material of the present invention wherein aluminum and a metal having a lower ionization tendency than that of aluminum are present in contact with each other include an embodiment wherein aluminum and a metal having a lower ionization tendency than that of aluminum exists as an alloy or a mere mixture thereof to form a single metal layer, and an embodiment wherein a metal having a lower ionization tendency than that of aluminum is present on an aluminum layer in a discontinuous layer state (i.e., particle-like, island-like or network condition). Japanese patent application (OPI) No. 139720/75 (corresponding to U.S. patent application Ser. No. 571,817, filed Apr. 25, 1975) gives detailed descriptions on these embodiments and methods of production thereof, this disclosure being incorporated herein by reference.

Examples of metals having a lower ionization tendency than that of aluminum include, for example, manganese, gallium, chromium, iron, cobalt, nickel, indium, lead, tin, antimony, bismuth, copper, silver, palladium, gold, etc. Of these, iron is a preferred metal. As an embodiment of the metal layer wherein aluminum and a metal having a lower ionization tendency than that of aluminum are present in contact with each other (hereinafter referred to merely as a metal layer), that wherein both metals form a single layer is preferred.

In any embodiment, the molar ratio (or atomic ratio) of the metal having a lower ionization tendency than that of aluminum to aluminum should be in the range of from about 0.1% to about 50%, preferably from about 0.2% to about 20%.

The above-described metal layer can be provided on the base material using, e.g., vacuum evaporation, and vacuum evaporation is mainly referred to hereinafter. However, needless to say, any known processes for forming a thin film such as a sputtering process, an ion-plating process, an electro-deposition process, a gas phase precipitation process, a spraying process, etc., can be employed in addition to the vacuum evaporation process as long as the intended embodiments can be obtained.

The thickness of the metal layer depends upon the optical density necessary for the resulting images. For example, where images are lines or dots, a comparatively high density is necessary. That is, an optical density of not less than about 2.0, in particular at least 3.0, where the light-sensitive material of the present invention is to be used as a mask for photographic printing of presensitized printing plates, is necessary. Thus, the thickness is determined to correspond to such an optical density. The figure illustrates the experimental values obtained as an example of the relationship between the thickness of the metal layer and the optical density, wherein a vacuum evaporated aluminum-iron alloy film was used as the metal layer. From curve 1 shown in the figure, it is seen that a thickness of about 400 Å is necessary for obtaining an optical density of 2.0, and about 600 Å for obtaining an optical density of 3.0. This relationship between the thickness of the metal layer and the optical density substantially holds for other cases, although it varies slightly depending upon the process for forming the metal layer, for example, upon the conditions used in the vacuum evaporation. Increasing the thickness of the metal layer to a thickness greater than is necessary for obtaining the desired optical density can be employed, if desired, although such is not desirable since the material for the metal layer is wasted and the etching time required for forming images is prolonged. Increasing the thickness of the metal layer more than is necessary should rather be avoided taking into consideration the fact that prolonged etching can deteriorate the resist. Thus, the thickness of the metal layer is at least about 300 Å, preferably from about 400 Å to about 1,000 Å.

The developer for the metal image-forming material of the present invention is an aqueous solution containing an alkaline compound. Examples of usable alkaline compounds include lithium hydroxide, sodium hydroxide, potassium hydroxide and calcium hydroxide. The alkalinity of the developer should be selected taking into consideration factors such as the formula of light-sensitive resin composition, the thickness of the light-sensitive resin composition layer, the kind and composition of the metals of the metal layer, and developing rate but, in general, it ranges from a pH of about 10 to a pH of about 14, preferably from a pH of about 10 to a pH of about 13.5.

Alkali metal salts of halogen-containing oxygen acids such as alkali metal salts of hypochlorous acid, alkali metal salts of chloric acid, alkali metal salts of bromous acid, alkali metal salts of bromic acid, alkali metal salts of periodic acid, etc.; and alkali metal salts such as alkali metal salts of orthophosphoric acid, alkali metal salts of pyrophosphoric acid, alkali metal salts of triphosphoric acid, etc., (alkali metal: lithium, sodium, potassium) can be incorporated into the developer, either individually or in combination. The amount of the compound having oxidizing power ranges from about 0.2% by weight to about 5% by weight, preferably from about 0.4% by weight to about 2% by weight, based on the total amount of developer. The content of the compound having oxidizing power can be appropriately determined also depending upon the etchability for the metal layer.

If necessary, organic solvents such as $\beta$-hydroxyethyl methyl ether (methyl Cellosolve), $\beta$-acetoxyethyl methyl ether (Cellosolve acetate), benzyl alcohol, etc., may be incorporated in the developer in a proportion of from 0.1% by weight to 10% by weight based on the total amount of developer. Incorporation of an organic solvent in the developer improves the desirable etchability. Etchability as used herein means the shortness of time required for etching and the sharpness of the etched areas. That is, the shorter the etching time means a good processing property of image development, and the sharpness of the etched areas is one necessary condition for obtaining good image quality.

The image-forming material of the present invention can be used by subjecting the image-forming material to an image-size reduction processing after image-wise exposure and development processing. A reducer may basically be selected from the same scope of various compositions used as an etching solution for the metal thin layer of the above-described metal image-forming material. That is, an alkaline solution or an acidic solution may be used. However, since dot images are made of a metal mainly containing aluminum, an acidic solution will form a stable oxide film on the aluminum surface and etching will proceed to only some extent and not proceed any further. Therefore, an alkaline solution is preferably used. A sodium hydroxide aqueous solution, a potassium hydroxide aqueous solution or the like whose pH has been adjusted to a pH of 11 or higher is preferred as the alkaline solution. Further, a reducer to be used in the present invention may contain a material which prevents the generation of foam upon etching, such as sodium bromate, sodium iodate, etc. A suitable amount of this additional material which prevents the generation of foam upon etching used in the reducer ranges from about 0.1 to about 20% by weight, preferably 0.2 to 5% by weight.

The light-sensitive resin composition of the present invention can be used for a metal image-forming material, a material for manufacturing printed circuit plates, a material for a light-sensitive printing plate and materials for ordinary image reproduction. Also, the metal image-forming material of the present invention can be used as printed circuit plates, printing plates and for forming metal images. Thus, they exhibit excellent effects in their respective uses.

The present invention will now be illustrated in more detail by reference to the following non-limiting examples of preferred embodiments of the present invention. Unless otherwise indicated herein, all parts, percentages, ratios and the like are by weight.

EXAMPLE 1

A suitable amount of $Al_5Fe_1$ alloy was placed in a tungsten boat disposed in a vacuum evaporation apparatus, and a 100 $\mu$m-thick polyethylene terephthalate film was disposed in a circular manner relative thereto within the vacuum evaporation apparatus at a distance of about 30 cm from the evaporation source. Vacuum evaporation coating was conducted under a pressure of $5 \times 10^{-5}$ torr until a monitor ("DTM-200", made by Sloan Co.) indicated a film thickness of 600 Å had been obtained to prepare a polyethylene terephthalate film having deposited thereon a layer of aluminum and iron (hereinafter referred to as a metal layer-deposited film). On this metal layer was coated the following light-sensitive composition in a dry thickness of 1.5 $\mu$m using a whirler, and dried for 2 minutes at a temperature of 100° C.

| Light-Sensitive Composition | | |
|---|---|---|
| Benzyl Methacrylate-Methacrylic Acid Copolymer (average molar ratio of repeating units: 73:27; $[\eta]=0.12$ in methyl ethyl ketone solution at 30° C) (binder) | 1 | g |
| Pentaerythritol Tetraacrylate | 0.8 | g |
| Triphenyl Phosphate | 0.07 | g |
| N-Methyl-2-benzoylmethylene-$\beta$-naphthothiazole (sensitizer) | 0.05 | g |
| Behenic Acid | 0.02 | g |
| $\beta$-Acetoxyethyl Methyl Ether | 6 | g |
| 1,2-Dichloroethane | 9 | g |

Then, the resulting light-sensitive material was exposed for 30 seconds through a negative mask using a PS Light (a 2 kw metal halide lamp, manufactured by Fuji Photo Film Co., Ltd.) positioned at a distance of 1 m, and developed for 30 seconds at 31° C. using a developer of the following composition:

| Developer | |
|---|---|
| Sodium Hydroxide | 4 g |
| Potassium Bromate | 10 g |
| Sodium Phosphate (Na$_3$PO$_4$ . 12H$_2$O) | 10 g |
| Sodium Aluminate (NaAlO$_2$) | 3 g |
| Water | 1 l |

Thus, the unexposed areas of the light-sensitive layer and underlying metal layer were substantially simultaneously etched away in the mono-bath processing.

The optical density of the thus obtained image was 3.0 or more, and the resolving power was 100 lines/mm or more. The film strength of the image was sufficiently good.

Then, in order to reduce the size of the dots in specific areas of the image to a desired level, the image was brought into contact with a reducer having the following composition:

| Reducer | |
|---|---|
| Sodium Hydroxide | 3 g |
| Potassium Borate | 6 g |
| Sodium Aluminate (NaAlO$_2$) | 1 g |
| Water | 10 ml | and left for 1 minute. Thus, the area of the size of 50% dots was reduced to a range of from about 10% to about 15% less through side etching. No pinholes were formed in the dots during this processing.

REFERENCE EXAMPLE 1

In the same manner as in Example 1 except for using 1 g of a methyl methacrylate-methacrylic acid copolymer (average molar ratio of repeating units: 85:15; [$\eta$]=0.12 in a methyl ethyl ketone solution at 30° C.), an image was obtained. The resulting image was substantially the same as in Example 1. However, when subjected to a reduction processing in the same manner as in Example 1, pinholes were formed in part of the dots.

EXAMPLE 2

On a metal layer of a metal layer-deposited film prepared in the same manner as in Example 1 was coated the following light-sensitive composition in a dry thickness of 3 μm using a whirler, and dried for 2 minutes at a temperature of 100° C.

| Light-Sensitive Composition | | |
|---|---|---|
| Benzyl Methacrylate-Methacrylic Acid Copolymer (average molar ratio of repeating units: 65:35; [$\eta$]=0.11 in a methyl ethyl ketone solution at 30° C) (binder) | 1 | g |
| Pentaerythritol Tetraacrylate | 0.8 | g |
| Chlorinated Polyethylene (Superchlon 907-LTA-ES*, made by Sanyo Kokusaku Pulp Co., Ltd.) | 0.2 | g |
| N-Methyl-2-benzoylmethylene-$\beta$-naphthothiazole (sensitizer) | 0.05 | g |
| Behenic Acid | 0.02 | g |
| $\beta$-Acetoxyethyl Methyl Ether | 6 | g |
| 1,2-Dichloroethane | 9 | g |

*Superchlon 907-LTA-ES is a compound having a viscosity of about 120 cps in a 40% by weight toluene solution at 25° C, and containing 66% by weight or more chlorine.

Then, the resulting light-sensitive material was exposed for 40 seconds through a negative mask in the same manner as in Example 1, and subsequently processed in the same manner as in Example 1 to obtain a metal image, which was further subjected to reduction processing in the same manner as in Example 1. Thus, the same results as in Example 1 were obtained.

EXAMPLE 3

On a metal layer of a metal layer-deposited film prepared in the same manner as in Example 1 was coated the following composition in a dry thickness of 3 μm using a whirler, then dried for 2 minutes at a temperature of 100° C.

| Light-Sensitive Composition | | |
|---|---|---|
| Benzyl Methacrylate-Methacrylic Acid Copolymer (average molar ratio of repeating units: 78:22; [$\eta$]=0.10 in a methyl ethyl ketone solution at 30° C) (binder) | 1 | g |
| Pentaerythritol Tetraacrylate | 0.8 | g |
| Triphenyl Phosphate | 0.07 | g |
| Chlorinated Polyethylene (Superchlon 907-LTA-ES) | 0.02 | g |
| N-Methyl-2-benzoylmethylene-$\beta$-naphthothiazole (sensitizer) | 0.05 | g |
| Behenic Acid | 0.01 | g |
| $\beta$-Acetoxyethyl Methyl Ether | 6 | g |
| 1,2-Dichloroethane | 9 | g |

Then, the resulting light-sensitive material was exposed for 30 seconds through a negative mask in the same manner as in Example 1, and developed for 30 seconds at 31° C. using a developer of the following composition:

| Developer | |
|---|---|
| Sodium Hydroxide | 4 g |
| Sodium Chlorite | 5 g |
| Sodium Carbonate (decahydrate) | 10 g |
| Sodium Aluminate (NaAlO$_2$) | 3 g |
| $\beta$-Hydroxyethyl Butyl Ether | 20 ml |
| Water | 1 l |

Thus, the unexposed areas of the light-sensitive layer and underlying metal layer were substantially simultaneously etched away in the mono-bath processing. The optical density of the thus obtained image was 3.0 or more, and the resolving power was 100 lines/mm or more. The film strength of the image was sufficiently good.

Then, in order to reduce the size of the dots in specific areas of the image to a desired level, the image was processed in the same manner as in Example 1 using a reducer having the following composition:

| Reducer | |
|---|---|
| Sodium Hydroxide | 4 g |
| Sodium Chlorite | 3 g |
| Sodium Aluminate (NaAlO$_2$) | 1 g |
| Water | 100 ml |

Thus, the same results as in Example 1 were obtained.

EXAMPLE 4

On a metal layer of a metal layer-deposited film prepared in the same manner as in Example 1 was coated the following light-sensitive composition in a dry thickness of 3 μm using a whirler, then dried for 2 minutes at a temperature of 100° C.

| Light-Sensitive Composition | | |
|---|---|---|
| Benzyl Methacrylate-Methacrylic Acid Copolymer (average molar ratio of repeating units: 73:27; $[\eta]=0.12$ in a methyl ethyl ketone solution at 30° C.) (binder) | 1 | g |
| Trimethylolpropane Triacrylate | 0.8 | g |
| Triphenyl Phosphate | 0.07 | g |
| Chlorinated Polyethylene (Superchlon 907-LTA-ES) | 0.2 | g |
| N-Methyl-2-benzoylmethylene-β-naphthothiazole (sensitizer) | 0.05 | g |
| Behenic Acid | 0.02 | g |
| β-Acetoxyethyl Methyl Ether | 6 | g |
| 1,2-Dichloroethane | 9 | g |

Then, the resulting light-sensitive material was exposed for 40 seconds through a negative mask in the same manner as in Example 1, and subsequently processed in the same manner as in Example 1 to obtain a metal image. Then, the resulting image was further reduction-processed in the same manner as in Example 1. Thus, the same results as in Example 1 were obtained.

EXAMPLE 5

On a metal layer of a metal layer-deposited film prepared in the same manner as in Example 1 was coated the following light-sensitive composition in a dry thickness of 3 μm using a whirler, then dried for 2 minutes at a temperature of 100° C.

| Light-Sensitive Composition | | |
|---|---|---|
| Benzyl Acrylate-Methacrylic Acid Copolymer (average molar ratio of repeating units: 73:27; $[\eta]=0.12$ in a methyl ethyl ketone solution at 30° C.) (binder) | 1 | g |
| Pentaerythritol Tetraacrylate | 0.8 | g |
| Chlorinated Polyethylene (Superchlon 907-LTA-ES) | 0.2 | g |
| 2-(o-Chlorophenyl)-4,6-di-(m-methoxyphenyl)imidazolyl Dimer (sensitizer) | 0.05 | g |
| Behenic Acid | 0.02 | g |
| β-Acetoxyethyl Methyl Ether | 6 | g |
| 1,2-Dichloroethane | 9 | g |

Then, the resulting light-sensitive material was exposed for 25 seconds through a negative mask in the same manner as in Example 1, and subsequently processed in the same manner as in Example 1 to form a metal image, and further reduction-processed in the same manner as in Example 1. Thus, the same results as in Example 1 were obtained.

EXAMPLE 6

In the same manner as in Example 2 except for using a benzyl methacrylate-acrylic acid copolymer (average molar ratio of the repeating units: 70:30; $[\eta]=0.11$ in a methyl ethyl ketone solution at 30° C.) as a binder, the same good results as in Example 2 were obtained.

EXAMPLE 7

In the same manner as in Example 2 except for using a benzyl methacrylate-styrene-methacrylic acid copolymer (average molar ratio of the repeating units: 60:13:17; $[\eta]=0.10$ in a methyl ethyl ketone solution at 30° C.) as a binder, the same results as in Example 2 were obtained.

EXAMPLE 8

Both surfaces of a 3S aluminum plate were sandblasted with 2.50 mesh alundum, and immersed in a 20% by weight Na$_3$PO$_4$ aqueous solution for 1 minute. After washing the plate with water, it was immersed in a 70% by weight nitric acid solution for 1 minute, then in a 2 wt% aqueous solution of sodium silicate No. 2 (made by Nippon Kagaku Co., Ltd.; ratio of silicic acid component to sodium component = 2.45–2.55:1) (heated to 80° C.) for 30 seconds. After washing the plate with water, the same light-sensitive resin composition as in Example 2 was coated on the plate in a dry thickness of 2 μm using a whirler, and dried for 2 minutes at a temperature of 100° C. The thus obtained light-sensitive material was exposed in the same manner as in Example 1, and developed for 1 minute at 30° C. using a developer having the following composition:

| Developer | | |
|---|---|---|
| Sodium Hydroxide | 3 | g |
| Sodium Phosphate (Na$_3$PO$_4$ . 12H$_2$O) | 10 | g |
| Water | 1 | l |

More than 30,000 excellent impressions were printed by loading the resulting image on a printing machine.

EXAMPLE 9

In the same manner as in Example 1 except for using an aluminum-silver layer in place of the aluminum-iron alloy, the same results as in Example 1 were obtained. The aluminum-silver layer used herein was prepared by vacuum evaporating aluminum in a thickness of 600 Å and then depositing thereon silver in a thickness of 5 Å.

While the invention has been described in detail and with reference to specific embodiments thereof, it will be apparent to one skilled in the art that various changes and modifications can be made therein without departing from the spirit and scope thereof.

What is claimed is:

1. An alkaline developable light-sensitive resin composition containing (a) at least one ethylenically unsaturated compound having at least two terminal ethylenically unsaturated groups, which is capable of forming a polymer through photo-addition polymerization, and which has a boiling point of about 100° C. or higher at atmospheric pressure, (b) an addition polymerization initiator activatable by irradiation with actinic radiation, and (c) an organic high polymer binder having water-solubilizing groups in the side chains thereof, wherein the improvement comprises said binder being a copolymer containing (A) a repeating unit derived from at least one compound selected from the group consisting of acrylic acid and methacrylic acid and (B) a representing unit derived from at least one compound selected from the group consisting of benzyl acrylate, benzyl methacrylate, phenethyl acrylate, phenethyl methacrylate, 3-phenylpropyl acrylate, 3-phenylpropyl methacrylate, 4-phenylbutyl acrylate and 4-phenylbutyl methacrylate.

2. The light-sensitive resin composition of claim 1, wherein said ethylenically unsaturated compound is an acrylic or methacrylic ester of a polyhydric alcohol, a reaction product between an acrylic or methacrylic ester derived from bisphenol A, an acrylic or methacrylic ester of bisphenol A alkylene oxide adduct or the hydrogenated product thereof, methylenebisacrylamide, methylenebismethacrylamide, a bisacrylamide or bismethacrylamide of a diamine, a reaction product between a diol monoacrylate or diol monomethacrylate and a diisocyanate, triacrylformal, triallyl cyanurate, or a linear high polymer having an acryloyloxy or methacryloyloxy group in the side chain thereof.

3. The light-sensitive resin composition of claim 1, wherein said ethylenically unsaturated compound is pentaerythritol tetraacrylate or trimethylolpropane triacrylate.

4. The light-sensitive resin composition of claim 1, wherein said polymerization initiator is an acyloin derivative, decyl bromide, decyl chloride, decyl amine, a ketone, a substituted benzophenone, a quinone, a substituted multi-nuclear quinone, a halogenated aliphatic, alicyclic or aromatic hydrocarbon, or a hetero ring compound.

5. The light-sensitive resin composition of claim 1, wherein the proportion of said ethylenically unsaturated compound ranges from about 20 to about 70% by weight based on the weight of the light-sensitive resin composition, the amount of the addition polymerization initiator ranges from about 0.1% by weight to about 10% by weight, based on the weight of said ethylenically unsaturated compound, and the amount of the organic high polymer binder ranges from about 40 to about 80% by weight based on the weight of the light-sensitive resin composition.

6. The light-sensitive resin composition of claim 1, wherein the proportion of repeating units (A) to repeating units (B) in said organic high polymer binder ranges from about 15% to about 40% for said repeating units (A) and about 60% to about 85% for said repeating units (B).

7. A metal image-forming material which comprises a base material having provided thereon a metal layer and an alkaline developable light-sensitive resin composition layer in this order and which provides images when subjected to image-wise exposure to actinic radiation and subsequently to a developing process using an alkaline developer to remove said light-sensitive resin composition layer and said metal layer in conformity with the image; said metal layer containing, in contact with each other, aluminum and a metal having a lower ionization tendency than that of aluminum, and said light-sensitive resin composition layer containing (a) at least one ethylenically unsaturated compound having at least two terminal ethylenically unsaturated groups, which is capable of forming a polymer through photo-addition polymerization, and which has a boiling point of about 100° C. or higher at atmospheric pressure, (b) an addition polymerization initiator activatable by irradiation with actinic radiation, and (c) an organic high polymer binder having water-solubilizing groups in the side chains, wherein the improvement comprises said binder being a copolymer containing (A) a repeating unit derived from at least one compound selected from the group consisting of acrylic acid and methacrylic acid and (B) a repeating unit derived from at least one compound selected from the group consisting of benzyl acrylate, benzyl methacrylate, phenethyl acrylate, phenethyl methacrylate, 3-phenylpropyl acrylate, 3-phenylpropyl methacrylate, 4-phenylbutyl acrylate and 4-phenylbutyl methacrylate.

8. The image-forming material of claim 7, wherein said ethylenically unsaturated compound is an acrylic or methacrylic ester of a polyhydric alcohol, a reaction product between an acrylic or methacrylic ester derived from bisphenol A, an acrylic or methacrylic ester of bisphenol A alkylene oxide adduct or the hydrogenated product thereof, methylenebisacrylamide, methylenebismethacrylamide, a bisacrylamide or bismethacrylamide of a diamine, a reaction product between a diol monoacrylate or diol monomethacrylate and a diisocyanate, triacrylformal, triallyl cyanurate, or a linear high polymer having an acryloyloxy or methacryloyloxy group in the side chain thereof.

9. The image-forming material of claim 7, wherein said ethylenically unsaturated compound is pentaerythritol tetraacrylate or trimethylolpropane triacrylate.

10. The image-forming material of claim 7, wherein said polymerization initiator is an acyloin derivative, decyl bromide, decyl chloride, decyl amine, a ketone, a substituted benzophenone, a quinone, a substituted multi-nuclear quinone, a halogenated aliphatic, alicyclic or aromatic hydrocarbon, or a hetero ring compound.

11. The image-forming material of claim 7, wherein the proportion of said ethylenically unsaturated compound ranges from about 20 to about 70% by weight based on the weight of the light-sensitive resin composition, the amount of the addition polymerization initiator ranges from about 0.1%f by weight to about 10% by weight, based on the weight of said ethylenically unsaturated compound, and the amount of the organic high polymer binder ranges from about 40 to about 80% by weight based on the weight of the light-sensitive resin composition.

12. The image-forming material of claim 7, wherein the proportion of repeating units (A) to the repeating units (B) in said organic high polymer binder ranges from about 15% to about 40% for said repeating units (A) and about 60% to about 85% for said repeating units (B).

13. The image-forming material of claim 7, wherein said metal having a lower ionization tendency than that of aluminum is manganese, gallium, chromium, iron, cobalt, nickel, indium, lead, tin, antimony, bismuth, copper, silver, palladium or gold.

* * * * *